United States Patent
Luoh et al.

(10) Patent No.: US 7,045,419 B2
(45) Date of Patent: May 16, 2006

(54) ELIMINATION OF THE FAST-ERASE PHENOMENA IN FLASH MEMORY

(75) Inventors: Tuung Luoh, Hsinchu (TW);
Ling-Wuu Yang, Hsinchu (TW);
Donald Huang, Hsinchu (TW);
Kuang-Chao Chen, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 10/733,230

(22) Filed: Dec. 12, 2003

(65) Prior Publication Data
US 2005/0130398 A1 Jun. 16, 2005

(51) Int. Cl.
*H01L 21/336* (2006.01)
(52) U.S. Cl. .............. 438/257; 438/197; 438/381
(58) Field of Classification Search ........... 438/257, 438/197, 263, 264, 381, 680, 681
See application file for complete search history.

(56) References Cited

U.S. PATENT DOCUMENTS

| | | | |
|---|---|---|---|
| 5,801,401 A * | 9/1998 | Forbes | 257/77 |
| 5,914,896 A | 6/1999 | Lee et al. | 365/185.19 |
| 6,166,401 A * | 12/2000 | Forbes | 257/77 |
| 6,309,907 B1 * | 10/2001 | Forbes et al. | 438/105 |
| 6,381,670 B1 | 4/2002 | Lee et al. | 711/103 |
| 6,586,797 B1 * | 7/2003 | Forbes et al. | 257/325 |
| 6,746,893 B1 * | 6/2004 | Forbes et al. | 438/105 |
| 6,762,068 B1 * | 7/2004 | Forbes et al. | 438/16 |
| 6,794,255 B1 * | 9/2004 | Forbes et al. | 438/285 |
| 6,835,638 B1 * | 12/2004 | Forbes et al. | 438/590 |

OTHER PUBLICATIONS

Seiichi Mori et al., "Polyoxide Thinning Limitation and Superior ONO Interpoly Dielectric for Nonvolatile Memory Devices", IEEE Transactions on Electron Devices, vol. 38, No. 2, Feb. 1991, pp. 270-277.
Seiichi Mori et al., "ONO Inter-Poly Dielectric Scaling for Nonvolatile Memory Applications", IEEE Transactions on Electron Devices, vol. 38, No. 2, Feb. 1991, pp. 386-391.

* cited by examiner

*Primary Examiner*—David Nhu
(74) *Attorney, Agent, or Firm*—Akin Gump Strauss Hauer & Feld, LLP

(57) ABSTRACT

A method of forming a semiconductor device that includes providing a semiconductor substrate, forming a first insulating layer over the semiconductor substrate, forming a floating gate over the first insulating layer with a reaction gas, wherein the floating gate comprises a microcrystalline material having a grain size of about 50–300 Å, forming a second insulating layer over the floating gate, and forming a control gate over the second insulating layer.

22 Claims, 1 Drawing Sheet

ELIMINATION OF THE FAST-ERASE PHENOMENA IN FLASH MEMORY

FIELD OF THE INVENTION

This invention relates to a method of forming a semiconductor device and, more particularly, to a method of forming a floating gate memory cell in a non-volatile memory device.

BACKGROUND OF THE INVENTION

A floating gate semiconductor memory device generally includes a plurality of memory cells, each comprising a MOS transistor with a floating gate to store charges. The MOS transistor of the memory cell also includes a control gate, a source region, a drain region, a substrate, and a channel defined as the region between the source region and the drain region. A first insulating layer is formed between the substrate and the floating gate, and a second insulating layer is formed between the floating gate and the control gate. The source and drain regions of the MOS transistor serve as bit lines of the memory cell, while the control gate of the MOS transistor serves as a word line of the memory cell. Each of the control gate, the source, the drain, and the substrate constitutes a terminal of the MOS transistor, and bias voltages may be applied to these terminals. Through different biasing schemes, a bit of information may be written into or erased from the memory cell.

During programming of the memory cell, bias voltages are applied to the terminals of the MOS transistor of the memory cell so that charges in the channel region, such as electrons, gain enough energy to tunnel through the first insulating layer between the substrate and the floating gate. This is generally known "hot-electron tunneling." For example, the control gate may be biased at a voltage level that is positive with respect to the bias at the source terminal or the drain terminal. As the charges tunnel through the first insulating layer to the floating gate, they are trapped in the floating gate, and, as a result, the threshold voltage of the MOS transistor is changed. Therefore, the threshold voltage can be an indicator of whether the memory cell is in a "0" state or a "1" state.

To erase the information bit from the memory cell, a different bias scheme is applied to the MOS transistor so that a mechanism called Fowler-Nordheim tunneling takes place, and charges stored in the floating gate may "tunnel" out from the floating gate. Fowler-Nordheim tunneling mechanism is well-known to one skilled in the art and will not be described herein. One conventional method of erasing the information bit from a memory cell is to apply a negative bias at the control gate of the MOS transistor and a positive bias at the source terminal, while leaving the drain terminal of the MOS transistor floating. The bias at the negative control gate, together with the bias at the source region, creates an electrical field between the floating gate and the source that forces the electrical charges stored in the floating gate to tunnel to the source region through the first insulating layer. As such, this method is known as "source tunneling."

However, when these charges tunnel from the floating gate to the source region, there also exists a band-to-band tunneling, i.e., carriers tunneling between two energy bands, over the overlap region between the control gate and source region. This unintended and undesirable band-to-band tunneling becomes more substantial as devices are scaled down in size to adversely effect the operations of the memory device.

Another method of erasing a bit of information stored in the floating ate is to bias the substrate, the source, and the drain of the MOS transistor of the memory cell at a similar voltage level, while biasing the control gate of the memory cell at a voltage level that is negative with respect to the substrate bias. Thus, electron tunneling takes place over the entire channel region of the MOS transistor, and band-to-band tunneling is decreased. This method of erasing is known as "channel erasing," and is generally considered faster than source erasing.

However, because the erasing operation is performed over a plurality of memory cells at the same time, and these memory cells may not be uniform in size or threshold voltages, the channel erasing method may result in some of the cells being "overly erased," i.e., the channel region being depleted, and consequently, current leakages between neighboring bit lines, to adversely effect the operations of the memory device.

SUMMARY OF THE INVENTION

In accordance with the present invention, there is provided a method of forming a semiconductor device that includes providing a semiconductor substrate, forming a first insulating layer over the semiconductor substrate, forming a floating gate over the first insulating layer with a reaction gas, wherein the floating gate comprises a microcrystalline material having a grain size of about 50–300 Å, forming a second insulating layer over the floating gate, and forming a control gate over the second insulating layer.

Also in accordance with the present invention, there is provided a method of forming a semiconductor device that includes providing a silicon substrate, selective doping of the silicon substrate to form a plurality of bit lines in the silicon substrate, forming a first insulating layer over the silicon substrate, forming a floating gate over the first insulating layer, wherein the floating gate comprises an amorphous material, thermally treating the memory cell to transform the amorphous material into a microcrystalline material, forming a second insulating layer over the floating gate, and forming a control gate over the second insulating layer.

Still in accordance with the present invention, there is provided a method of forming a semiconductor memory device that includes providing a semiconductor silicon substrate, forming a plurality of bit lines in the silicon substrate, depositing a first insulating layer over the silicon substrate including the plurality of bit lines, forming a floating gate over the first insulating layer, wherein the floating gate comprises one of amorphous material or a microcrystalline material having a grain size of 50–300 Å, forming a second insulating layer over the floating gate, forming a plurality of word lines over the second insulating layer, and forming a layer of nitride over the plurality of word lines.

Additional features and advantages of the invention will be set forth in part in the description which follows, and in part will be obvious from the description, or may be learned by practice of the invention. The features and advantages of the invention will be realized and attained by means of the elements and combinations particularly pointed out in the appended claims.

It is to be understood that both the foregoing general description and the following detailed description are exemplary and explanatory and are intended to provide further explanation of the invention as claimed.

BRIEF DESCRIPTION OF THE DRAWINGS

The accompanying drawing, which is incorporated in and constitutes a part of this specification, illustrates embodiments of the invention and, together with the description, serves to explain the objects, advantages, and principles of the invention.

In the drawing.

DESCRIPTION OF THE EMBODIMENTS

Figure 1:
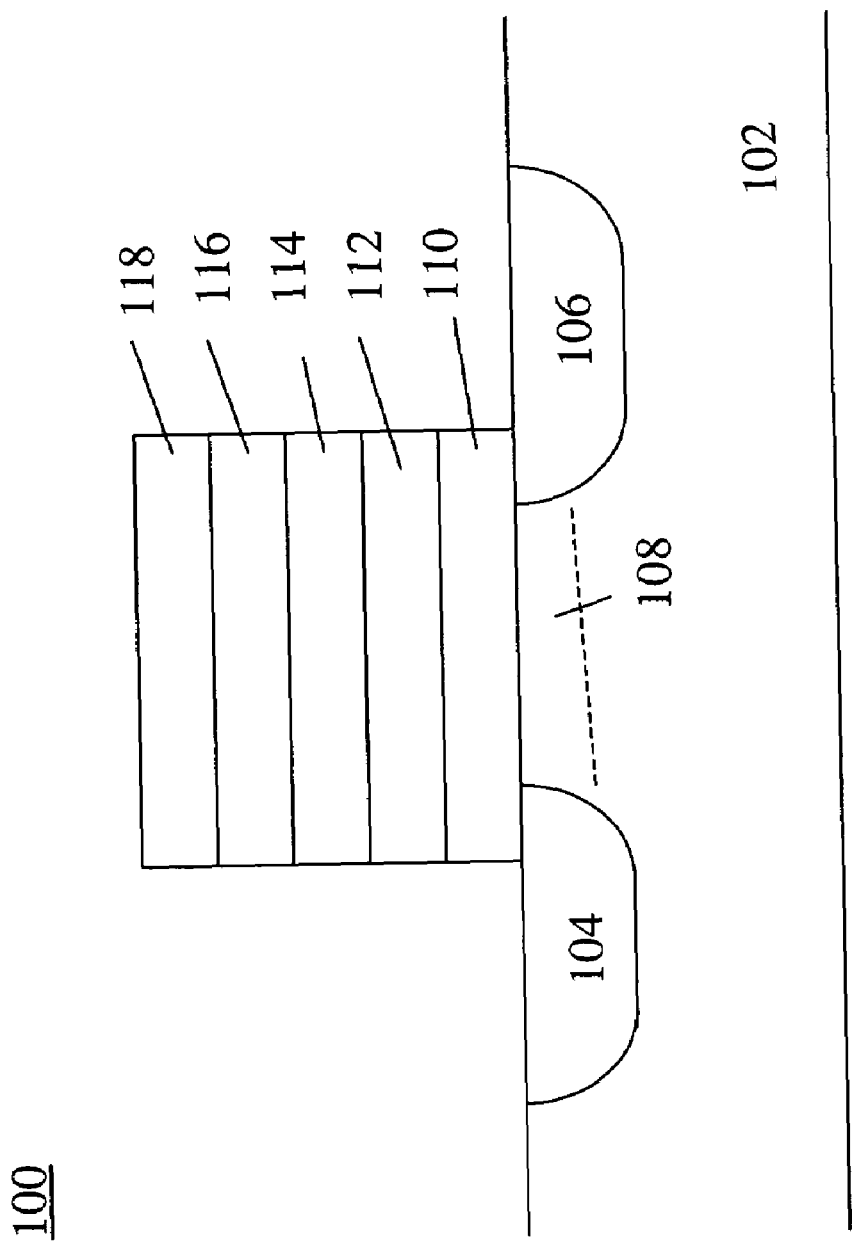
FIG. 1 shows a semiconductor device manufactured using the method according to an embodiment of the present invention.

According to the present invention, there is provided a method of forming a memory device, particularly a floating gate memory device. Such a memory device may include a plurality of memory cells, each for storing at least one bit of information. Each memory cell comprises a MOS transistor with a floating gate, a control gate, a source region, a drain region, a channel region defined between the source and drain regions, and a substrate. The control gate serves as part of one word line of the memory cell, and the source and drain regions serve as parts of two bit lines of the memory cell.

The method of forming a memory device 100 according to an embodiment of the present invention includes providing a semiconductor substrate 102. Semiconductor substrate 102 may be comprised of silicon or any other semiconductor material used in semiconductor technology. The conductivity type of the semiconductor substrate can be either p-type or n-type. Through conventional masking steps, selective doping of the semiconductor substrate is performed to form a plurality of bit lines, or source region 104 and drain region 106 of the MOS transistors (not numbered). The selective doping process may be performed with any conventional method, such as ion implantation, and diffusion. The dopant used in this step may be either n-type or p-type, depending on the conductivity type of the substrate. Source region 104 and drain region 106 of each MOS transistor also define a channel region 108 therebetween.

After the formation of the bit lines, a first insulating layer 110 is formed over the surface of semiconductor substrate 102 having bit lines 104 and 106 formed thereon. First insulating layer 110 may be comprised of oxide, nitride, or any other dielectric material or combination thereof commonly used in the art. A floating gate 112 is then formed over first insulating layer 110 and is electrically insulated from the substrate 102 by first insulating layer 110. In one aspect, floating gate 112 is comprised of amorphous silicon. In another aspect, floating gate 112 is comprised of microcrystalline polysilicon. In one aspect, the microcrystalline polysilicon has a grain size of about 50–300 Å. In another aspect, the microcrystalline polysilicon has a grain size of about 200–600 Å.

Floating gate 112 may be formed with conventional chemical vapor deposition (CVD) method using a combination of gases that is comprised of a reaction gas and an optional second gas. In one aspect, the reaction gas is comprised of $SiX$, $Si_2Y$, or any appropriate combination thereof, wherein X is comprised of one or more of $H_4$, $H_2Cl_2$, $HCl_3$, $D_4$, $D_2Cl_2$, and $D_3Cl$, and Y is comprised of one or more of $H_6$, $H_4Cl_2$, $H_2Cl_4$, $D_6$, $D_4Cl_2$, and $D_2Cl_4$. In another aspect, the optional second gas is comprised of at least one or more of $D_2$, $H_2$, and $D_3$.

In one embodiment, the step of forming floating gate 112 comprises forming a layer of microcrystalline polysilicon over first insulating layer 110 with a grain size of about 50–300 Å, followed by a thermal treatment to increase the grain size to about 200–600 Å. In one aspect, the thermal treatment is performed in a conventional vertical furnace or rapid thermal process apparatus, with reaction gases including $N_2$, $O_2$, $H_2$, $N_2O$. In another aspect, the thermal treatment is performed at a temperature of about 800° C.–1000° C.

In another aspect, the step of forming floating gate 112 comprises forming a layer of amorphous silicon over first insulating layer 110. A step of thermal treatment follows to transform the amorphous silicon into polysilicon with a grain size of about 200–500 Å. In one aspect, the thermal treatment is performed in a conventional vertical furnace or rapid thermal process apparatus, with reaction gases including $N_2$, $O_2$, $H_2$, $N_2O$. In another aspect, the thermal treatment is performed at a temperature of about 800° C.–1000° C.

Compared to a conventionally formed polysilicon gate, the floating gate of the present invention exhibits a higher gate coupling ratio (GCR), an improved swing degradation, and a lower electron-trapping rate for the first and second insulating layers.

Following the formation of floating gate 112, a second insulating layer 114 is formed over floating gate 112. Second insulating layer 114 may be comprised of oxide, nitride, or any other dielectric material commonly used in the art, or a combination thereof. A control gate 116 is then formed over second insulating layer 114. Control gate 116 may be comprised of polysilicon or any gate material commonly used in the art.

In one aspect, a cap layer 118 is further formed over the surface of control gate 116. Cap layer 118 may be comprised of silicon nitride (SiN). In operation, nitride cap layer 118 over control gate 116 improves the performance of the memory device, e.g., the difference in the threshold voltage of the MOS transistor for different memory cell, i.e., "0" and "1", is increased, and the endurance of memory device 100 is improved.

Conventional semiconductor manufacturing processes follow to complete the formation of the memory device and necessary circuits that accompany a memory device.

Compared to a flash memory device fabricated using a conventional process, the flash memory provided by the present invention has a higher and more stable cell read current, and therefore has a better operation performance.

It is to be understood that, although the method of forming a floating gate in the present invention has been described in conjunction with the fabrication of a memory device, it may as well be applied in other situations that would benefit from the microcrystalline structures so formed.

It will be apparent to those skilled in the art that various modifications and variations can be made in the disclosed process without departing from the scope or spirit of the invention. Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A method of forming a semiconductor device, comprising:
   providing a semiconductor substrate;
   forming a first insulating layer over the semiconductor substrate;

forming a floating gate over the first insulating layer with a reaction gas, wherein the floating gate comprises a microcrystalline material having a grain size of about 50 Å–300 Å;

forming a second insulating layer over the floating gate;

forming a control gate over the second insulating layer; and forming a layer of nitride over the control gate layer.

2. The method of claim 1, wherein the first insulating layer comprises an oxide, a nitride, or a combination thereof.

3. The method of claim 1, wherein the second insulating layer comprises an oxide, a nitride, or a combination thereof.

4. The method of claim 1, wherein the floating gate is formed with a combination of the reaction gas and a second gas.

5. The method of claim 4, wherein the reaction gas comprises SiX, wherein X comprises at least one of $H_4$, $H_2Cl_2$, $HCl_3$, $D_4$, $D_2Cl_2$, and $D_3Cl$.

6. The method of claim 4, wherein the reaction gas comprises SiX, $Si_2Y$, or a combination of SiX and $Si_2Y$.

7. The method of claim 6, wherein X comprises at least one of $H_4$, $H_2Cl_2$, $HCl_3$, $D_4$, $D_2Cl_2$, and $D_3Cl$.

8. The method of claim 6, wherein Y comprises at least one of $H_6$, $H_4Cl_2$, $H_2Cl_4$, $D_6$, $D_4Cl_2$, and $D_2Cl_4$.

9. The method of claim 4, wherein the second gas comprises one or more of $D_2$, $H_2$, and $D_3$.

10. The method of claim 1, further comprising forming a plurality of bit lines in the semiconductor substrate.

11. The method of claim 1, further comprising thermally treating the floating gate to increase the grain size of the microcrystalline material to about 200 Å–600 Å.

12. A method of forming a semiconductor device having a memory cell, comprising:

providing a silicon substrate;

selectively doping the silicon substrate to form a plurality of bit lines in the silicon substrate;

forming a first insulating layer over the silicon substrate;

forming a floating gate over the first insulating layer, wherein the floating gate comprises an amorphous material;

thermally treating the memory cell to transform the amorphous material into a microcrystalline material;

forming a second insulating layer over the floating gate; and forming a control gate over the second insulating layer.

13. The method of claim 12, whether the grain size of the microcrystalline material is about 200 Å–500 Å.

14. The method of claim 12, wherein the step of forming the floating gate further comprises depositing the floating gate with a combination of gases, wherein the combination of gases comprise a reaction gas.

15. The method of claim 14, wherein the reaction gas comprises SiX, $Si_2Y$, or a combination of SiX and $Si_2Y$, wherein X comprises at least one of $H_4$, $H_2Cl_2$, $HCl_3$, $D_4$, $D_2Cl_2$, and $D_3Cl$, and Y comprises at least one of $H_6$, $H_4Cl_2$, $H_2Cl_4$, $D_6$, $D_4Cl_2$, and $D_2Cl_4$.

16. The method of claim 14, wherein the step of forming the floating gate further comprises depositing the floating gate with a combination of the reaction gas and a second gas comprising at least one of $D_2$, $H_2$, and $D_3$.

17. The method of claim 12, further comprising forming a layer of nitride over the control gate.

18. A method of forming a semiconductor memory device, comprising:

providing a semiconductor silicon substrate;

forming a plurality of bit lines in the silicon substrate;

depositing a first insulating layer over the silicon substrate including the plurality of bit lines;

forming a floating gate over the first insulating layer, wherein the floating gate comprises one of amorphous silicon or polysilicon having a grain size of 50 Å–300 Å;

forming a second insulating layer over the floating gate;

forming a plurality of word lines over the second insulating layer; and forming a layer of nitride over the plurality of word lines.

19. The method of claim 18, further comprising thermally treating the floating gate so that the floating gate has a grain size of about 200 Å–500 Å.

20. The method of claim 1, wherein the floating gate is a polysilicon floating gate.

21. The method of claim 12, wherein the floating gate is a polysilicon floating gate.

22. The method of claim 18, wherein the floating gate is a polysilicon floating gate.

* * * * *